United States Patent [19]
Lee et al.

[11] Patent Number: 5,897,350
[45] Date of Patent: Apr. 27, 1999

[54] MEMORY CELL STRUCTURE FOR SEMICONDUCTOR MEMORY DEVICE AND FABRICATING METHOD THEREOF

[75] Inventors: Chang-Jae Lee; Won-Suck Yang, both of Cheongju, Rep. of Korea

[73] Assignee: LG Semicon Co., Ltd., Choongcheongbuk-Do, Rep. of Korea

[21] Appl. No.: 08/780,173

[22] Filed: Dec. 24, 1996

[30] Foreign Application Priority Data

Dec. 30, 1995 [KR]  Rep. of Korea ........................ 95/68659

[51] Int. Cl.⁶ ............................................... H01L 21/8242
[52] U.S. Cl. ............................................ 438/238; 438/253
[58] Field of Search .................................... 438/238, 239, 438/253–256, 381, 396–399

[56] References Cited

U.S. PATENT DOCUMENTS

| | | | |
|---|---|---|---|
| 5,091,761 | 2/1992 | Hiraiwa et al. ........................ | 357/23.6 |
| 5,140,389 | 8/1992 | Kimura et al. ........................ | 357/23.6 |
| 5,776,825 | 7/1998 | Suganaga et al. ..................... | 438/618 |
| 5,792,687 | 8/1998 | Jeng et al. .............................. | 438/253 |
| 5,798,289 | 8/1998 | Ajika et al. ............................. | 438/239 |

*Primary Examiner*—Joni Chang
*Attorney, Agent, or Firm*—Morgan, Lewis & Bockius LLP

[57] ABSTRACT

A memory cell structure for a semiconductor memory device and fabricating method thereof, which is suitable for DRAM memory devices of 256M or more capacity requiring a very high degree of integration, which comprises the steps of forming sequentially first and second random layers on a semiconductor substrate; patterning a first photoresist layer having a limited line width on the second random layer; patterning the second random layer using as a mask the patterned first photoresist layer; removing the first photoresist layer, and then patterning the second photoresist layer having the limited line width between the pattern of the second random layer; patterning the first random layer using as a mask the second photoresist layer which is so patterned so as to be placed between the pattern of the second random layer; and removing the second random layer and the second photoresist layer.

4 Claims, 12 Drawing Sheets

MEMORY CELL STRUCTURE FOR SEMICONDUCTOR MEMORY DEVICE AND FABRICATING METHOD THEREOF

BACKGROUND OF THE INVENTION

1. Field of the Invention

The present invention relates to a memory cell structure of of semiconductor memory device, and particularly to a memory cell structure of semiconductor memory device and fabricating method thereof suitable to a highly integrated memory device by using a line patterning method to overcome a resolution limitation.

2. Description of the Conventional Art

There have been proposed many kinds of cell arrays and structures for a highly integrated semiconductor dynamic random access memory (DRAM) device.

The conventional semiconductor memory device as shown in FIG. 1A and 1B adopts a capacitor under bit line (CUB) structure in which a capacitor is formed in a rectangular active region a on a silicon substrate, and then a bit line is formed. In the figure, the capacitor consists of a node electrode 1a and a plate electrode 1b. The reference signal WL designates word lines. In a memory cell of the CUB structure, the capacitor being below the bit lines, is restricted in its area. In order to obtain the same capacitance in a highly integrated memory device as in an existing one, it is required to increase the topology of the capacitor. However, this, results in an increase of the aspect ratio of the bit line contact hole, which is accompanied by a technical difficulty in filling up the contact hole with a conductive layer and in line patterning. therefore, such a memory cell structure is not suitable for a highly integrated memory device.

For 16M or 64M DRAM semiconductor elements, a new cell array and a structure thereof are required. FIGS. 2A and 2B show a semiconductor memory element of a capacitor over bit line (COB) structure as disclosed in U.S. Pat. No. 5,140,389 which designed to increase the capacitance by first forming the bit lines and securing the area for the capacitor above the upper part of the bit lines (BL) . The capacitor consists of a node electrode 1a and a plate electrode 1b. In such structure, it is inevitably to design the active region a in a diagonal form so as to make the bit lines (BL) and word lines (WL) cross after the capacitor is formed on the bit line BL. Consequently, there have arisen the problems that the phenomena of a significant reduction or distortion of the pattern can occur upon forming the active region a in a diagonal form, it is difficult to secure space for the active regions and to form an exact pattern, and the packing density is reduced. For this reason, a new memory cell array and structure is required for a very highly integrated memory device (256M or more DRAM).

As shown in FIGS. 3A to 3I, the memory cells for semiconductor memory devices adopting the COB structure as shown in FIG. 2 are fabricating through the following steps:

(a) implanting boron ions B$^+$ into the substrate 1. forming an oxide film 2 of SiO2 on the substrate 1 in a thickness of about 100 Å, and then depositing a nitride film 3 of Si3N4 in a thickness of about 1400 Å by means of a low-pressure chemical vapor deposition (LPCVD);

(c) patterning the active regions a by forming a photoresist layer 4 on the nitride film 3, and then forming a field channel stop layer by implanting boron into the substrate;

(d) removing the patterned photoresist layer 4, removing the nitride film 3 after forming a field oxide film 5, and then growing a gate oxide film 6 in a thickness of about 100 Å;

(e) depositing a doped polysilicon on the substrate 1, forming gate electrodes 7 on the active regions by patterning the polysilicon, and then forming lightly doped source/drain regions which are lightly doped drain (LDD) regions, by means of ion-implantation of phosphorous ions P+;

(f) depositing an insulation film on the surface of the substrate 1, forming side wall spacers on the gate electrode 7, and then forming doped n+ source/drain regions by implanting arsenic ions As+ into the substrate 1;

(g) coating an insulation film 10 on the surface of the semiconductor substrate 1, forming contact holes for bit line contact by exposing a part of each active region of the substrate 1, forming sequentially a polysilicon film 11, a tungsten silicide WSi2 film and an insulation film 13 so as to fill up the contact hole, and forming, after patterning the insulation film 13, the bit lines in the polysilicon film 11 and then the tungsten silicide film 12 using the insulation film 13 as mask;

(h) forming contact holes by exposing a part of the substrate 1 on which the bit lines are formed, depositing and patterning a polysilicon film 14 on the substrate 1 so as to fill up the contact holes and to form the capacitor node electrodes; and (i) depositing a dielectric film 15 on the node electrodes, forming a plate electrode of the capacitors, and depositing a polysilicon film 1L6 on the dielectric film 15.

The semiconductor memory device adopting the conventional COB structure as described above, has problems in that because the active pattern is in a diagonal form and has so many corners, a considerable reduction or distortion of pattern can occur, the photolithography process is difficult, and the packing density to be formed in the same area is so los that it is disadvantageous to a high integration device.

SUMMARY OF THE INVENTION

The object of the present invention is to eliminate the problems in the memory cell structure for semiconductor memory device and fabricating method thereof in the conventional COB structure, and to provide a memory cell structure for semiconductor memory device and fabricating method thereof, which is suitable for DRAM memory devices of 256M or more capacity requiring a very high degree of integration.

To achieve the above object, there is provided a memory cell structure for a semiconductor memory device which includes a semiconductor substrate having a first conductivity type, including a plurality of active regions each having a first diffusion region and a second diffusion region which form a transistor, and an isolation region; a plurality of word lines formed on the semiconductor substrate and each acting as a gate electrode of a corresponding transistor; a first insulation film formed on the semiconductor substrate and the word lines; a contact hole formed to expose the first diffusion region through the first insulation film; a plurality of bit lines crossingly arranged above the word lines and contacting with a corresponding first diffusion region via a corresponding contact hole wherein each bit line includes a first bit line of a pad type contacting with the first diffusion region and a second bit line contacting with the first bit line over the isolation region in a straight line form; a second insulation film formed on the plurality of bit lines and the first insulation film; an electrode contact hole formed to expose the second diffusion region through the first and the second insulation film; a capacitor lower electrode formed on the second insulation film and contacting with a corresponding second diffusion region via a corresponding electrode contact hole; a capacitor dielectric layer formed on the capacitor lower electrode; and a capacitor upper electrode formed on the capacitor dielectric layer.

A preferred embodiment of semiconductor device fabricating method according to the present invention to attain the above object comprises the following steps of forming a gate electrode and first and second diffusion regions of a transistor on a semiconductor substrate, depositing a first insulation film on the semiconductor substrate, forming a first contact hole in the first insulation film by exposing the first diffusion region, depositing a first conductive layer on a surface of the first insulation film, filling up the first contact hole, forming on the first conductive layer a mask layer for forming a first bit line pattern, the mask having an etch selectivity different from the conductive layer, forming a photoresist layer for formation of a second bit line, in such way that a part of the photoresist layer overlaps on the mask layer, removing the exposed part of the first conductive layer using as a mask the mask and photoresist layers, forming a second insulation film on the surface of the semiconductor substrate, forming a second contact hole in the second insulation film exposing the second diffusion region, and depositing on the semiconductor substrate a second conductive layer to form a capacitor node electrode, and depositing sequentially a dielectric layer and a third conductive layer to form a capacitor plate electrode.

The line patterning method of memory cells for semiconductor devices according to the present invention, comprises the steps of forming sequentially first and second random layers on a semiconductor substrate, patterning a first photoresist layer having a limited line width on the second random layer, patterning the second random layer using as a mask the patterned first photoresist layer, removing the first photoresist layer, and then patterning the second photoresist layer having the limited line width between the pattern of the second random layer, patterning the first random layer using as a mask the second photoresist layer which is so patterned so as to be placed between the pattern of the second random layer, and removing the second random layer and the second photoresist layer.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The method of manufacturing memory cells for semiconductor memory devices according to the present invention will be described in detail in the following.

Figure 1A:
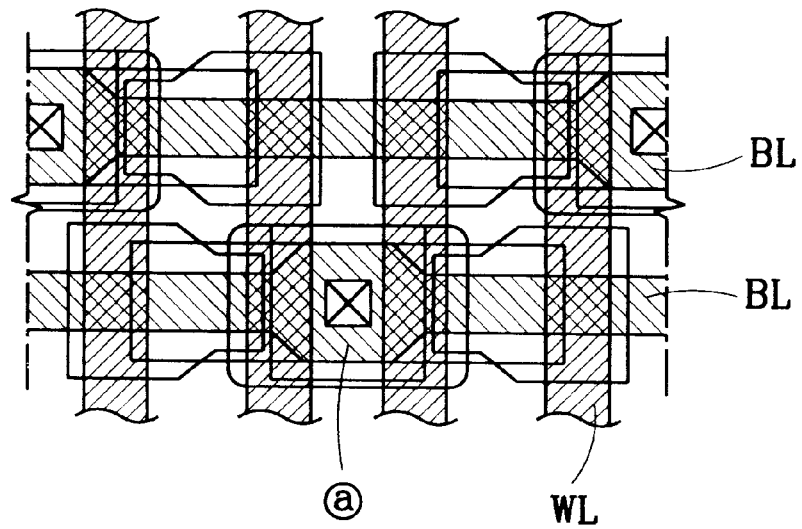
FIGS. 1A and 1B are a plan and a longitudinal section view showing a memory cell layout of a semiconductor device of the conventional capacitor under bit line structure.
Figure 1B:
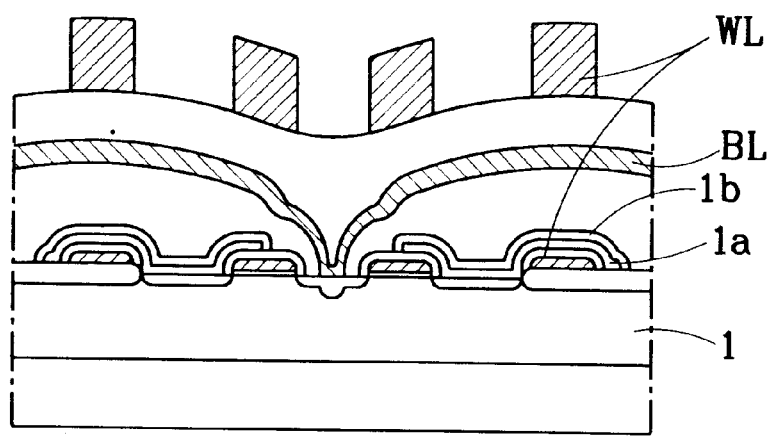
Figure 2A:
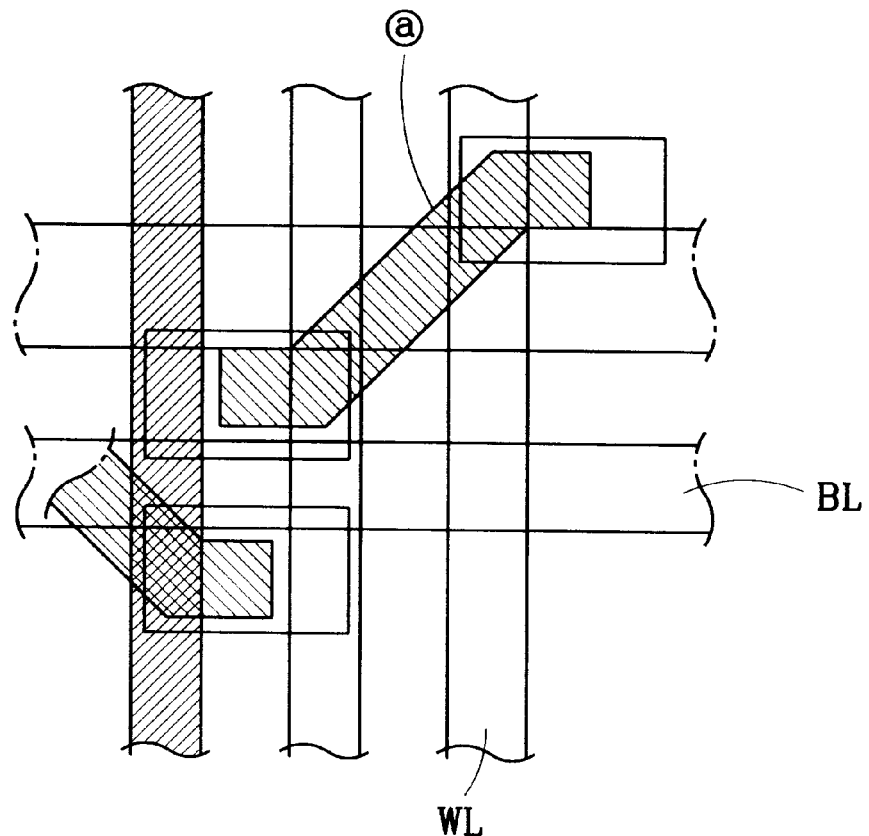
FIGS. 2A and 2B are a plan and a longitudinal section view showing a memory cell layout of a semiconductor device of the conventional capacitor over bit line structure.
Figure 2B:
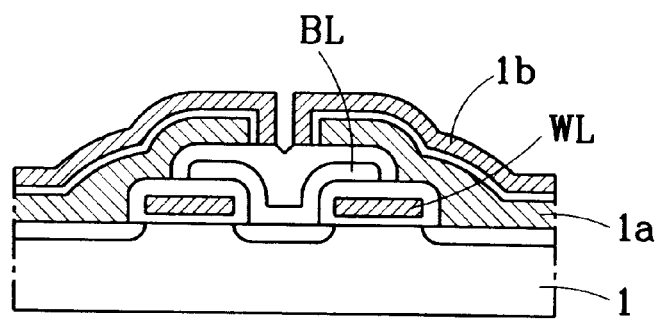
Figure 3A:
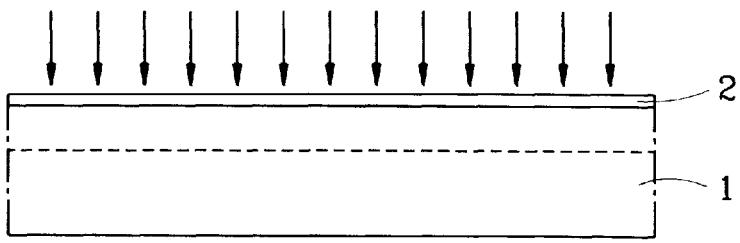
FIGS. 3A to 3I are views showing the manufacturing processes of the memory cells as shown in FIG. 2A.
Figure 3B:
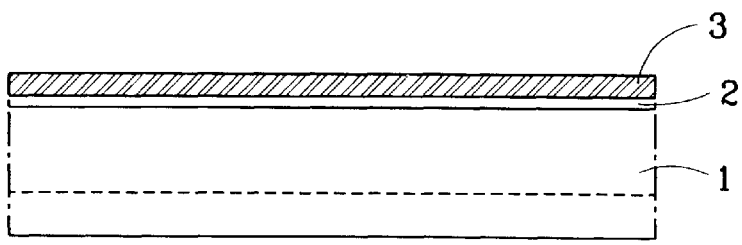
Figure 3C:
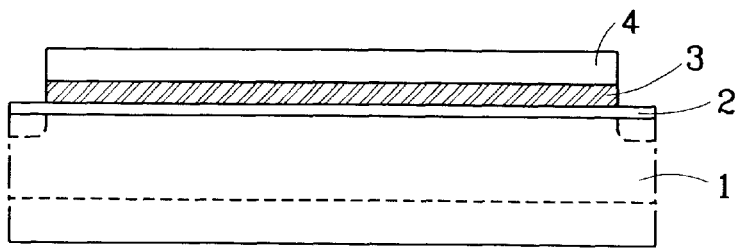
Figure 3D:
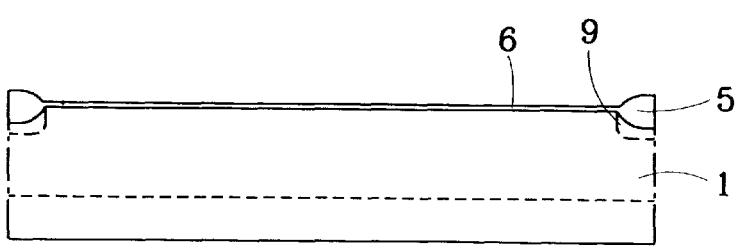
Figure 3E:
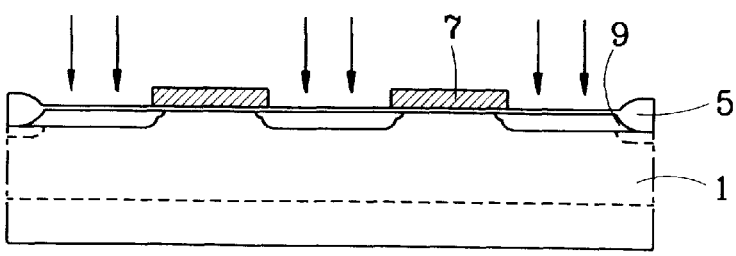
Figure 3F:
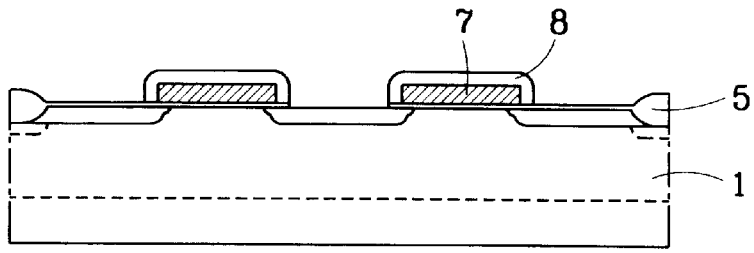
Figure 3G:
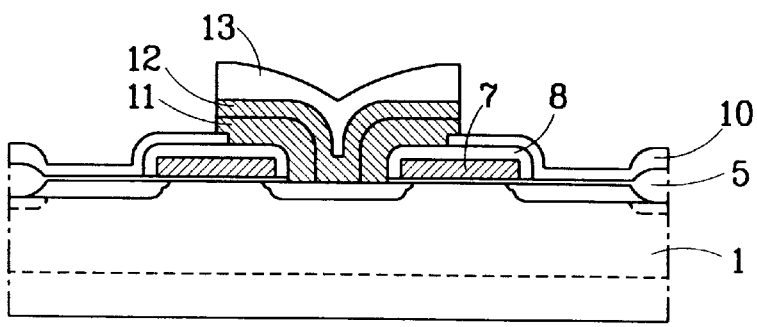
Figure 3H:
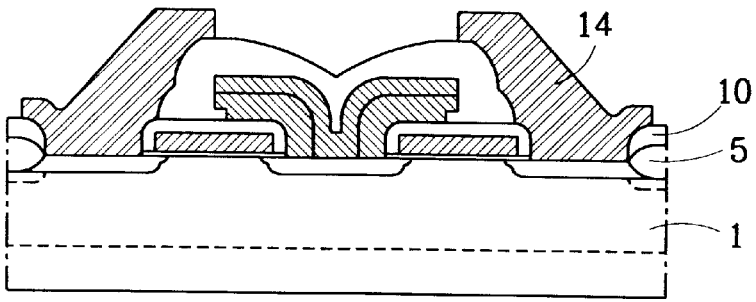
Figure 3I:
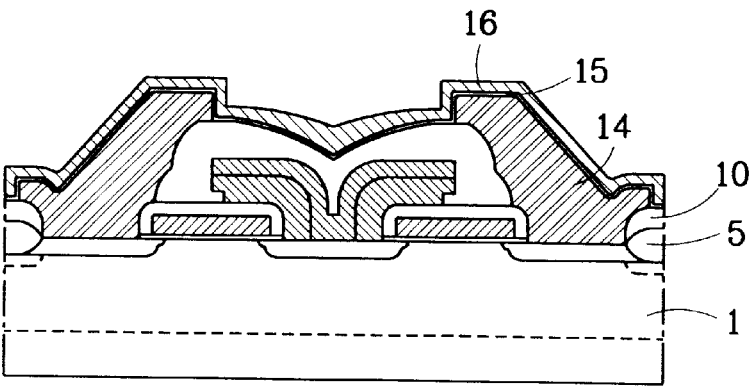
Figure 4A:
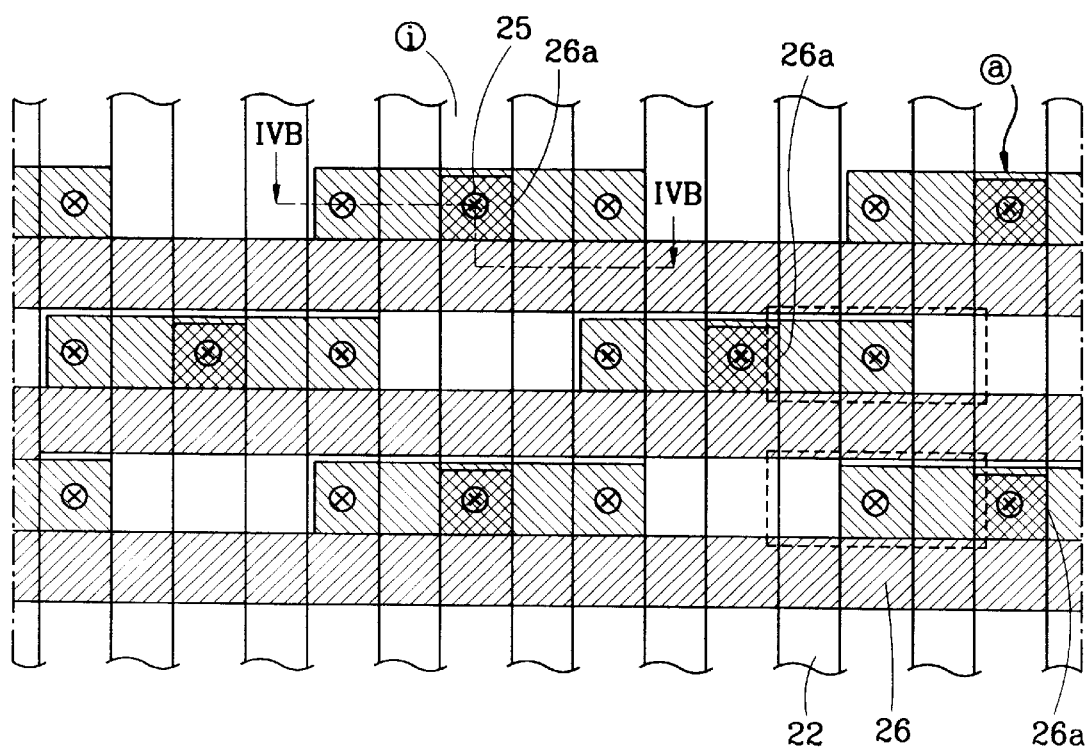
FIGS. 4A and 4B are a plan and a longitudinal section views showing memory cell layouts of a semiconductor device according to the present invention.

FIG. 4A is a plan view showing a memory cell layout of a semiconductor DRAM device according to the present invention, wherein a plurality of rectangular active regions (a) are formed on a semiconductor substrate 21, and a plurality of bit lines 26 are formed parallel to the active regions a and have contact portions 26a on the active regions (a).

Figure 4B:
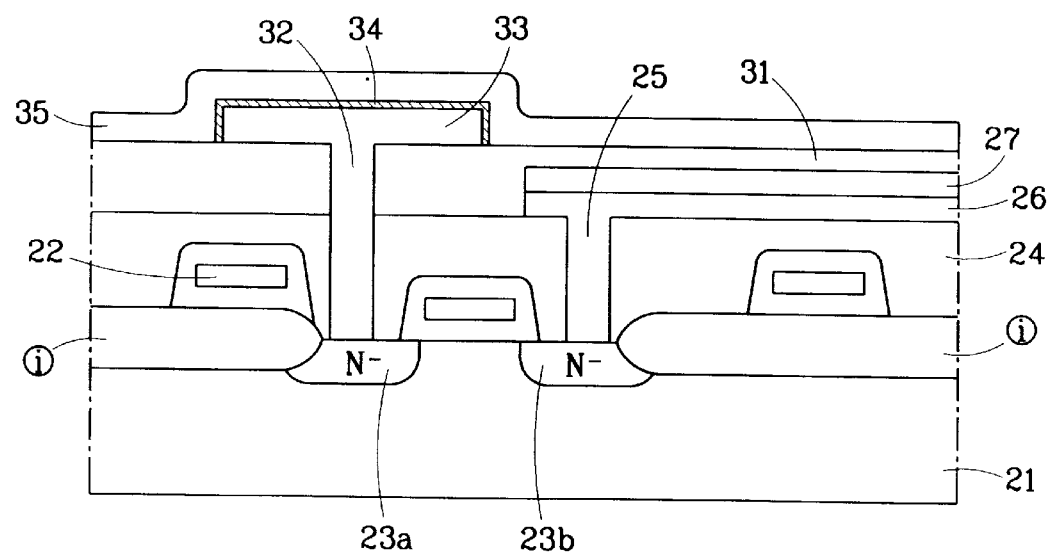

FIG. 4B is a section view taken along line A—A' in FIG. 4A, showing the memory cell of a semiconductor memory device according to the present invention. In the drawings, the bit lines are connected electrically with the active regions (a) through contact holes 25 of the first insulation film 24. Reference numeral (i) represents an element isolation region. Further detailed description of the drawings will be continued with reference to FIG. 5.

Figure 5A:
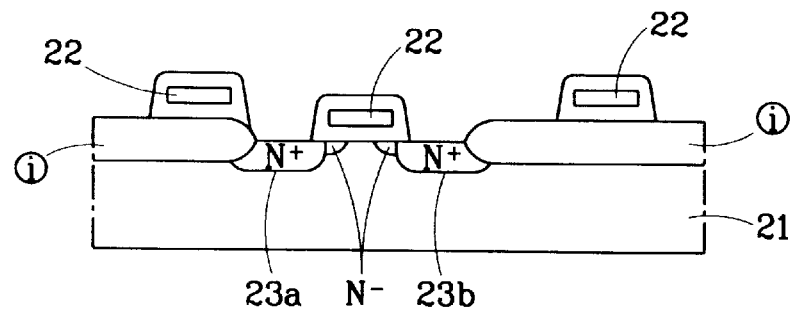
FIGS. 5A to 5L are longitudinal sections showing the manufacturing processes of memory cells for semiconductor memory devices according to the present invention.

FIG. 5A shows the fabrication of an NMOSFET device in progress up to a step of forming a gate electrode 22 and a first diffusion region 23a and a second diffusion region 23b of a transistor on a p-type silicon substrate 21.

Figure 5B:
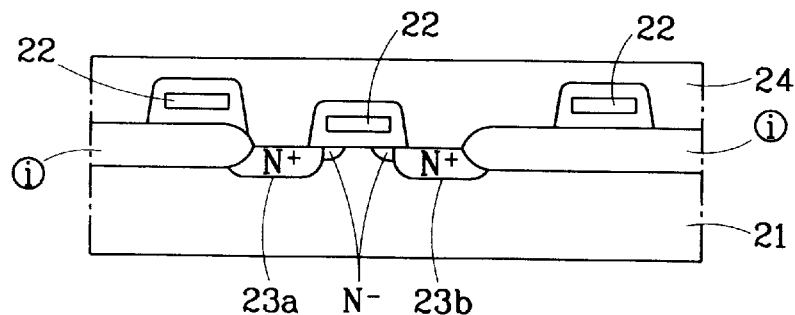

In FIG. 5B, a CVD oxide film $Sio_2$ is deposited in a thickness of 4000 Å as a first insulation film 24, on the substrate 21.

Figure 5C:
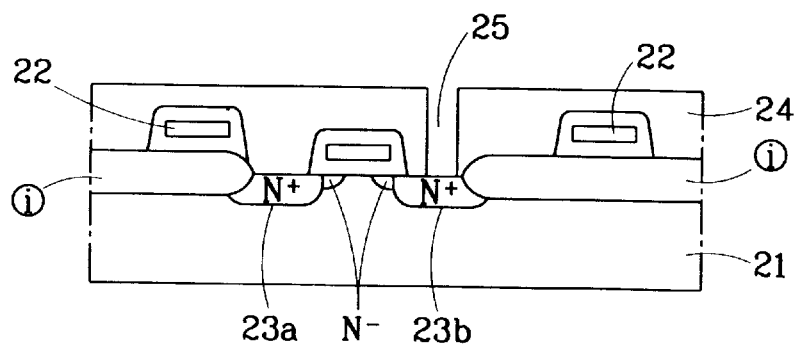

In FIG. 5C, the first diffusion region 23a of the substrate 21 is exposed by removing a portion of the CVD oxide film 24 through a photoetching process to form a contact hole 25 in such way that the bit line to be formed layer and the first diffusion region 23a of the active region (a) may be connected with each other.

Figure 5D:
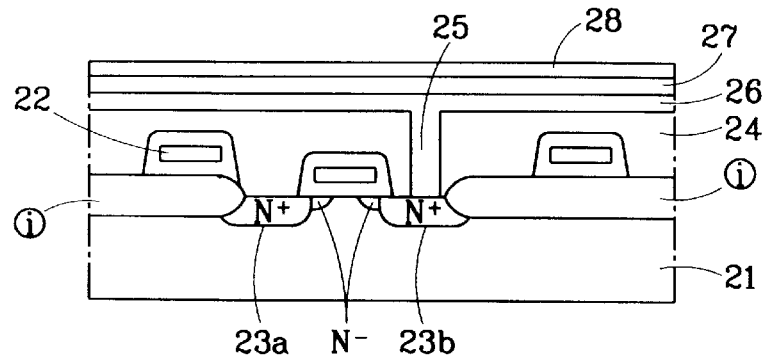

In FIG. 5D, an n-type doped polysilicon film 26 is formed in a thickness of about 4000 Å by means of an LPCVD on the first insulation film including the contact hole 25. The contact hole 25 is filled up with the polysilicon film 26. A CVD tungsten silicide 27 is formed in a thickness of about 1000 Å on the polysilicon film 26 to improve the conductivity of the bit line, and then a plasma silicon nitride film $Si_3N_4$ 28 is formed sequentially in a thickness of about 500 to 1000 Å. The plasma silicon nitride film 28 becomes an etching mask at the time the first bit line pattern is formed. Other substances the etching selectivity of which is different from that of the tungsten silicide 27 may be used in lieu of the silicon nitride film 28.

Figure 5E:
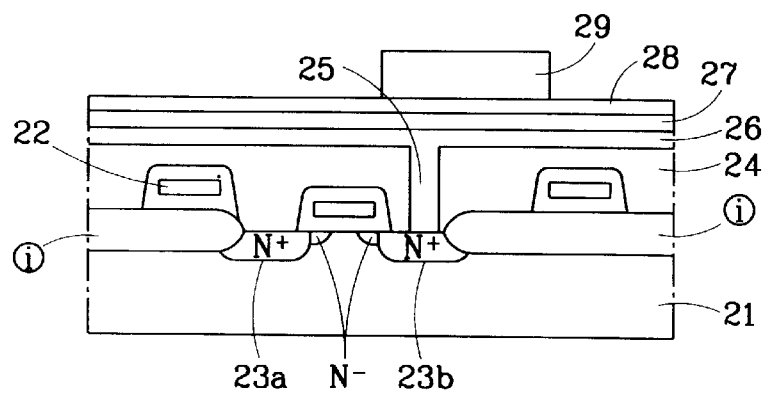

In FIG. 5E, a first photoresist is formed by coating a photoresist layer on the nitride film 28, and then the coated photoresist is patterned using a mask (not illustrated) with a first bit line pattern and a first bit line photoresist pattern is formed.

Figure 5F:
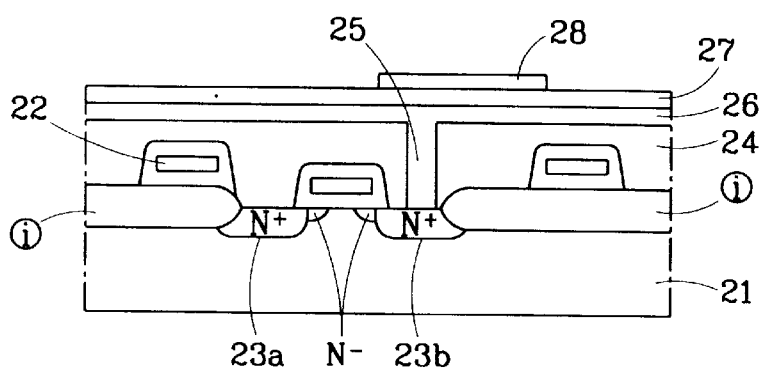

In FIG. 5F, the plasma silicon nitride film 28 exposed using as a mask the first bit line photoresist pattern, is removed by etching, and then a first bit line photoresist pattern 29 is removed.

Figure 5G:
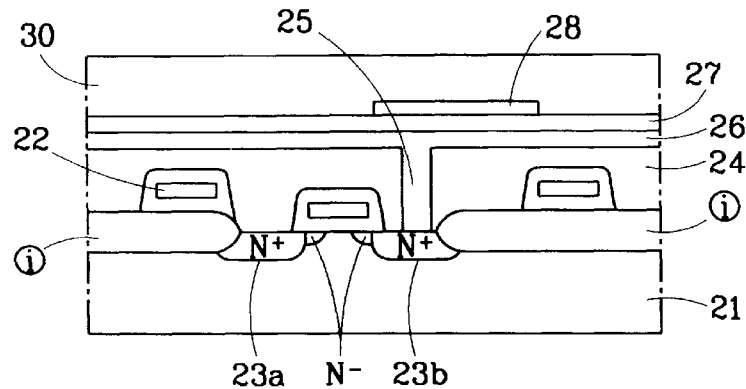

In FIG. 5G, a second photoresist is coated on the CVD tungsten silicide 27.

Figure 5H:
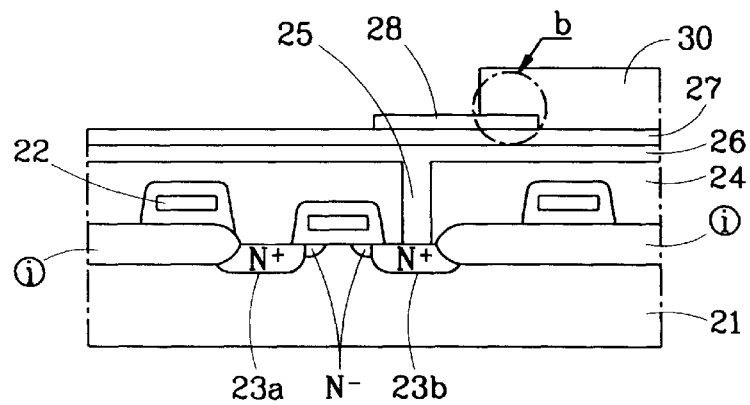

In FIG. 5H, the coated photoresist is patterned using a mask (not illustrated) with a second bit line pattern and a second bit photoresist pattern 30 is formed. Reference numeral b in the drawing designates a layout in which the second photoresist pattern 30 is overlapped with the patterned silicon nitride film 28.

Figure 5I:
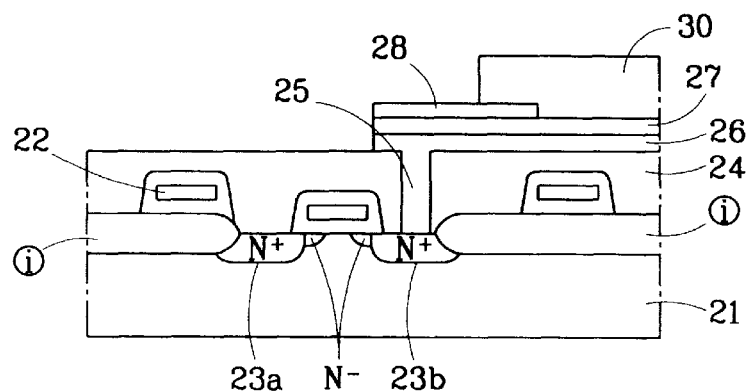

In FIG. 5I, the tungsten silicide layer 27 exposed by using as a mask layer the patterned silicon nitride film 28 and the second bit line photoresist pattern 30, and the polysilicon layer 26, are removed by etching. The bit line is formed through such process. Subsequentially, the capacitor manufacturing process proceeds.

Figure 5J:
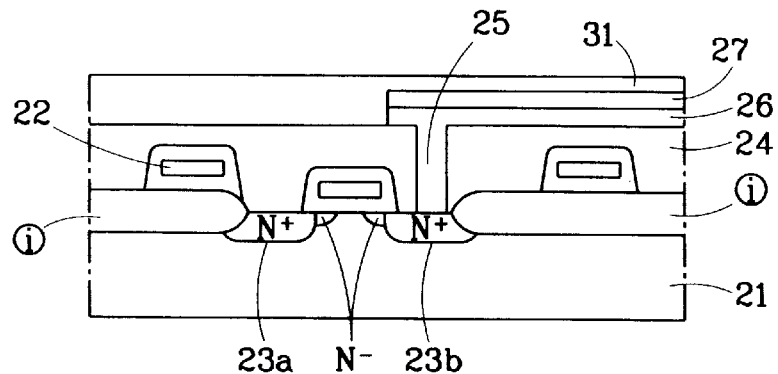

In FIG. 5J, the second bit line photoresist pattern 30 and the remaining silicon nitride film 28 are removed, and then a CVD oxide film $SiO_2$ is formed in a thickness of 3000 Å as a second insulation film 31.

Figure 5K:
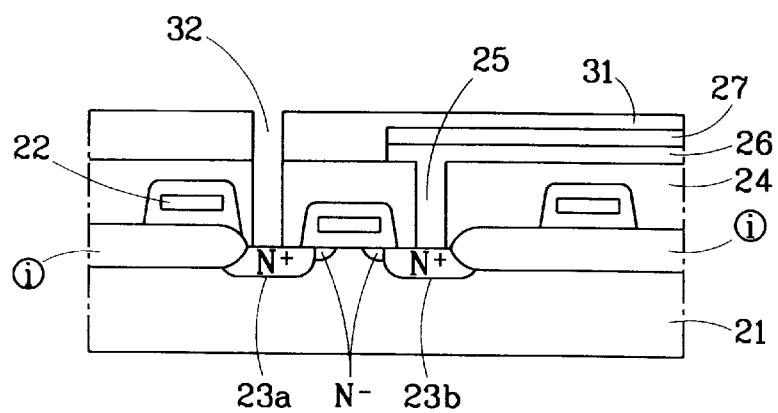

In FIG. 5K, a contact hole 32 is formed in the second insulation film 31 exposing a portion of the substrate 21.

Figure 5L:
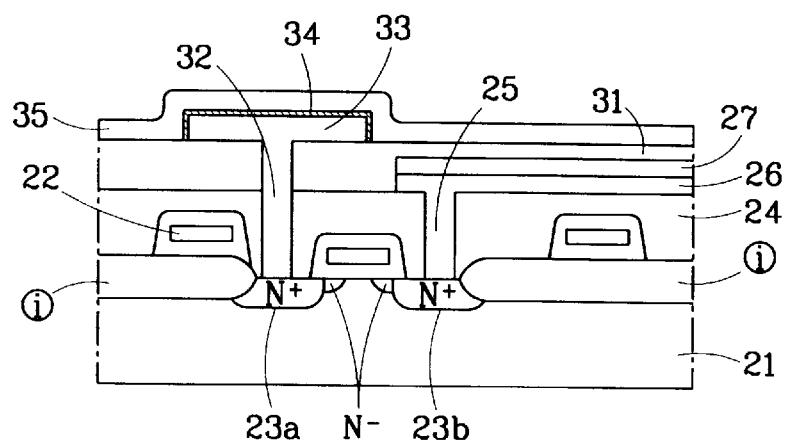

In FIG. 5L, a polysilicon film 33 which is a conductive layer to serve as a node electrode (lower electrode) of the capacitor, is deposited on the surface of the substrate 21, and the contact hole 32 is filled up with it. The polysilicon film 33 is patterned by means of the photolithography process. Finally, a capacitor dielectric 34 and a polisilicon 35 which becomes a plate electrode (upper electrode) of the capacitor, are formed sequentially.

The memory cell of the semiconductor device according to the present invention is completed through the above-described processes. the subsequent manufacturing process of the memory cell proceeds on the basis of the conventional manufacturing steps of semiconductor device.

The processes as shown in FIG. 5E and 5H will now be further described with reference to FIGS. 6A through 6C as follows.

Figure 6A:
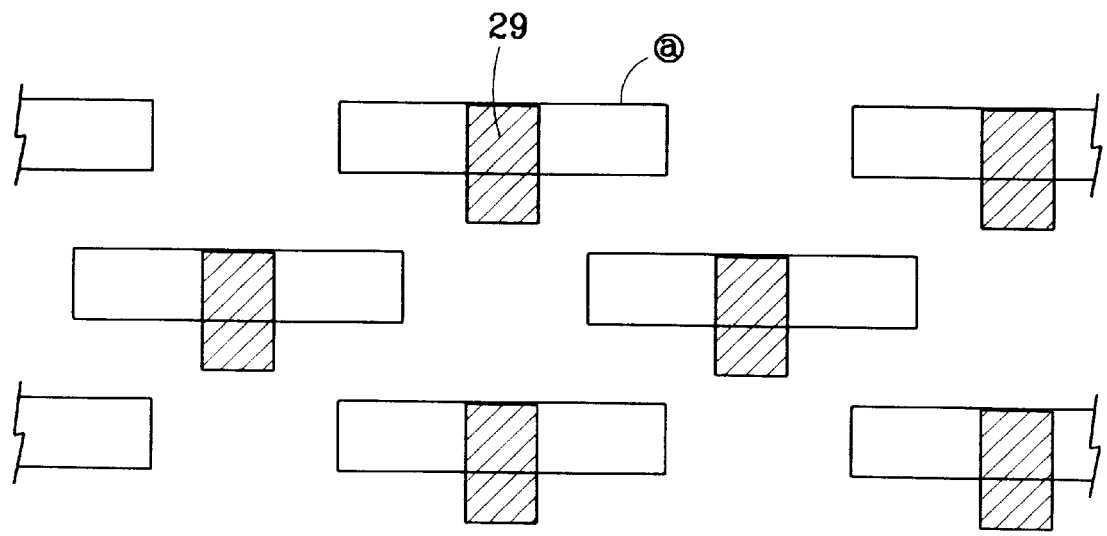
FIGS. 6A to 6C are plan views showing methods of patterning using a mask in the manufacturing process of a memory cell array for semiconductor memory devices according to the present invention.

FIG. 6A shows the step of arranging first bit lines on a corresponding number of active regions (a), using a mask (not shown) including the first bit lines as salient parts 26a of a plurality of bit lines 26. This process is followed by a process of removing the insulation film 28 be etching, using as a mask layer the first bit line photoresist pattern 29.

Figure 6B:
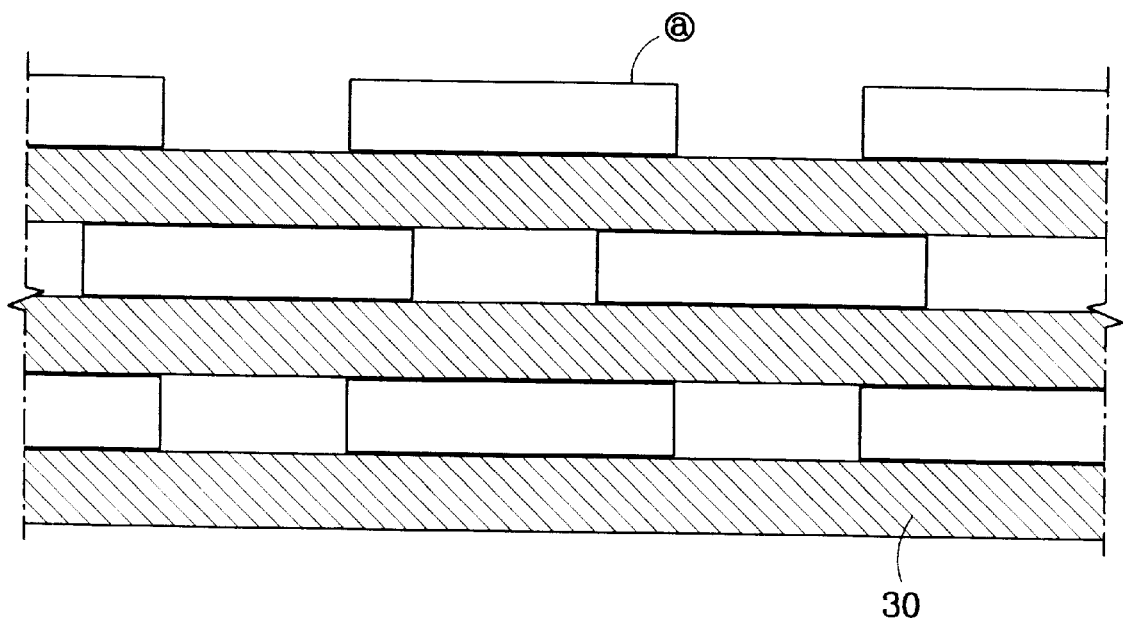

FIG. 6B shows the step of arranging the second bit line photoresist patterns 30 using a mask (not shown) including a plurality of second bit line patterns, so as to be parallel to a plurality of active regions (a).

Figure 6C:
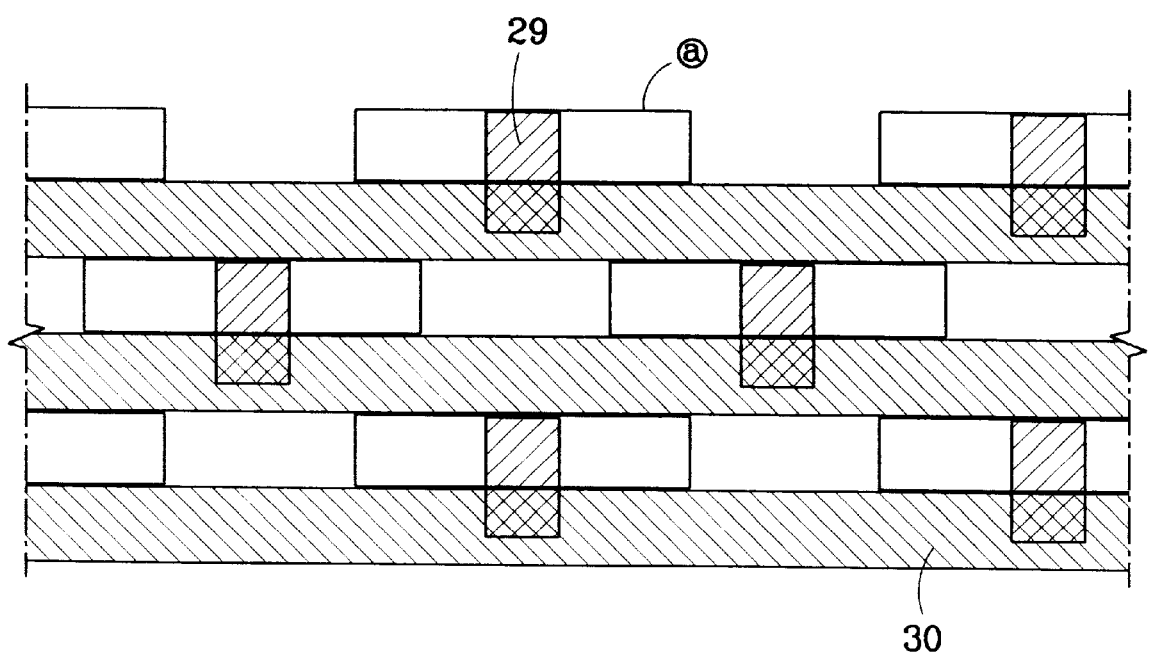

FIG. 6C shows the completed bit line patterns which are formed by the processes as shown in FIG. 6B continued after that in FIG. 6A, and is similar to FIG. 4A.

For the purpose of forming the bit line patterns, a method of making the patterning at one time through the same mask, may be considered, but in this case, a bridge may be formed between the bit lines due to the salient arranged between the bit lines. It is impossible to pattern the salient by the existing exposure techniques (deep ultraviolet or i-line techniques). However, as shown in FIG. 6, the present invention employs a patterning method using two masks so as to form bit line patterns in the limited line width by means of the existing exposure techniques.

The bit line patterning method according to the present invention as shown in FIG. 6 will now be described further in detail with reference to FIGS. 7A to 7F.

Figure 7A:
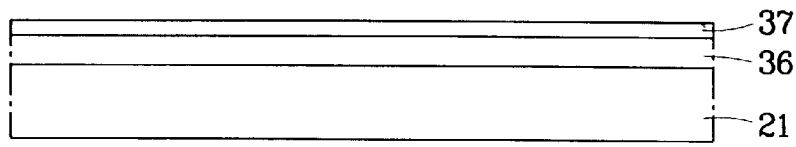
FIGS. 7A to 7F are side views showing the line patterning methods of memory cells for semiconductor memory devices according to the present invention.

In FIG. 7A, the first and second random layers 36 and 37 are formed on the semiconductor substrate 21.

Figure 7B:
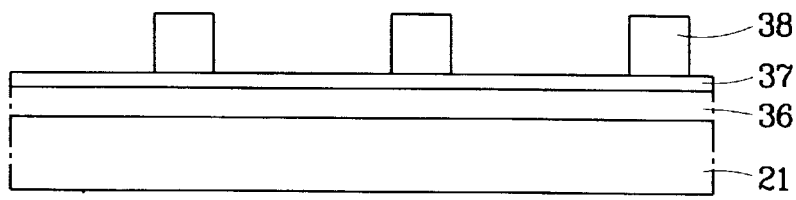

In FIG. 7B, a first photoresist layer 38 is coated on the random layer 37, and then the first photoresist layer 38 is patterned using a mask (not shown) in which patterns having the limited line width are formed.

Figure 7C:
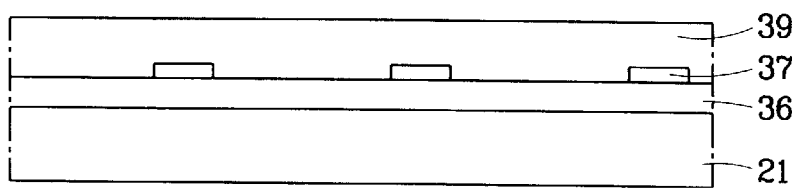

In FIG. 7C, the second random layer 37 is patterned using as a mask the patterned first photoresist layer 38, and then the first photoresist layer 38 is removed, and a second photoresist layer 39 is coated.

Figure 7D:
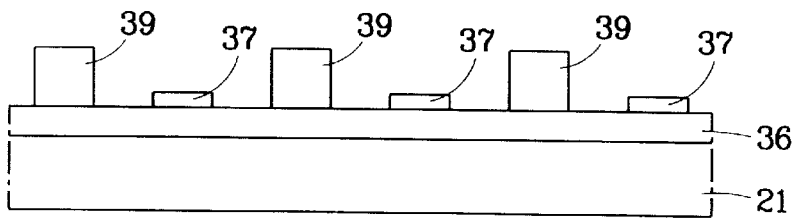

In FIG. 7D, the second photoresist layer 39 is patterned by aligning a mask (not shown) in which patterns of the first random layer having the limited width are formed so as to be placed between the patterned second random layer 37.

Figure 7E:
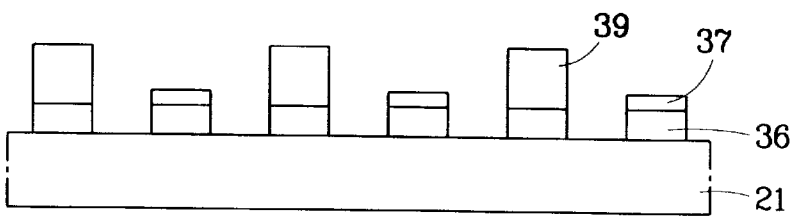

In FIG. 7E, the first random layer 36 exposed using as a mask the patterned second photoresist layer 39 and the second random layer 37, is removed by etching.

Figure 7F:
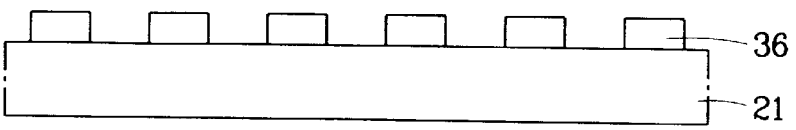

In FIG. 7F, the second random layer 37 and the second photoresist layer 39 are removed. Accordingly, the first random layer 36 is formed overcoming the limit of the resolution in the photolithography process.

As described above, the limit of the resolution of the exposure technique overcome by method of alignment between adjacent patterns using different masks.

Accordingly, the limit of the pattern intervals formed according to the present invention is not the limit of the resolution at the time of exposure, but depends only upon the range of the alignment error upon exposing such different masks between adjacent patterns.

As described above, the present invention has the effect that the difficulty in a higher integration due to the restriction on the area of the capacitor in the semiconductor memory element of the conventional CUB structure, can be eliminated by such CUB structure.

The present invention has the effect that the corners in the conventional COB structure are reduced to a minimum compared with a diagonal pattern, by forming the active regions in a rectangular form, and the possibility of producing crystalline defects is reduced remarkably, so that it is possible to improve the characteristics and reliability of semiconductor devices.

In the conventional art, the patterning is carried out within the limit of resolution of the exposure technique, while the present invention employs a patterning technique to overcome the limit of resolution in the exposure technique by forming the adjacent patterns by different masks, and sequentially making the patterning, which has the effect of greatly improving the degree of integration of memory cells of semiconductor devices.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A method of manufacturing a memory cell for a semiconductor memory device, comprising the steps of:

forming a gate electrode and first and second diffusion regions of a transistor on a semiconductor substrate;

depositing a first insulation film on the semiconductor substrate;

forming a first contact hole in the first, insulation film by exposing the first diffusion region;

depositing a first conductive layer on a surface of the first insulation film, filling up the first contact hole;

forming on the first conductive layer a mask layer having a first bit line pattern, the mask having an etch selectivity different from the conductive layer;

forming a photoresist layer having a second bit line photoresist pattern, in such way that a part of the second bit photoresist pattern overlaps the mask layer;

removing the exposed part of the first conductive layer using as a mask the mask and photoresist layers;

forming a second insulation film on a surface of the semiconductor substrate;

forming a second contact hole in the second insulation film exposing the second diffusion region; and depositing on the semiconductor substrate a second conductive layer to form a capacitor node electrode, and depositing sequentially a dielectric layer and a third conductive layer to form a capacitor plate electrode.

2. The method according to claim 1, wherein the first and second insulation films are silicon oxide films.

3. The method according to claim 1, wherein the first bit line pattern is extended laterally so as to connect with the second bit line pattern and the first contact hole.

4. The method according to claim 1, wherein the first conductive layer comprises a polysilicon film and a tungsten silicide film deposited on the polysilicon film.

* * * * *